United States Patent
Inaba et al.

(10) Patent No.: US 8,302,821 B2
(45) Date of Patent: Nov. 6, 2012

(54) PASTE APPLICATION DEVICE

(75) Inventors: Yuzuru Inaba, Fukuoka (JP); Osamu Okuda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 381 days.

(21) Appl. No.: 12/746,595

(22) PCT Filed: Nov. 17, 2008

(86) PCT No.: PCT/JP2008/003352
§ 371 (c)(1),
(2), (4) Date: Jun. 7, 2010

(87) PCT Pub. No.: WO2009/075064
PCT Pub. Date: Jun. 18, 2009

(65) Prior Publication Data
US 2010/0258591 A1   Oct. 14, 2010

(30) Foreign Application Priority Data
Dec. 10, 2007 (JP) .................................. 2007-318132

(51) Int. Cl.
*G01F 11/00* (2006.01)
*G01F 11/20* (2006.01)
*B65C 11/04* (2006.01)
*B05B 3/00* (2006.01)

(52) U.S. Cl. ........ 222/261; 222/260; 222/262; 222/411; 222/413; 222/168; 222/160; 118/300; 118/323; 118/407; 118/410; 156/578; 239/263.1

(58) Field of Classification Search .................. 222/261, 222/262, 260, 389, 411–413, 167, 168, 160; 118/300, 323, 407, 410; 156/578; 438/778, 438/782; 239/263.1, 263.2, 225.1
See application file for complete search history.

(56) References Cited

U.S. PATENT DOCUMENTS

| 5,265,773 | A  | * | 11/1993 | Harada | 222/261 |
| 6,386,396 | B1 | * | 5/2002  | Strecker | 222/261 |
| 7,694,857 | B1 | * | 4/2010  | Fugere | 222/413 |

FOREIGN PATENT DOCUMENTS

| JP | 10-244196 A    | 9/1998 |
| JP | 2003-117484 A  | 4/2003 |
| WO | 2007-058258 A1 | 5/2007 |

OTHER PUBLICATIONS

International Search Report for PCT/JP2008/003352.

* cited by examiner

*Primary Examiner* — Kevin P Shaver
*Assistant Examiner* — Nicholas Weiss
(74) *Attorney, Agent, or Firm* — Pearne & Gordon LLP

(57) ABSTRACT

There is provided a paste application device which can solve problems of an increased exclusively occupied space attributed to an arrangement of a syringe and of deterioration of a tube.

In a paste application unit 15 (a paste application device) for applying a paste 7 stored in a syringe 16 to an application target material, a configuration is adopted in which a pump mechanism 18 for sending the paste 7 under pressure is formed by causing a discharge thread portion 32b provided at a lower portion of a rotary member 32 to rotate about an axis AX within a discharge space 31b provided in a casing portion 31, in which a discharge port 17a, which communicates with the discharge space 31b, is provided at an end portion of the casing portion 31, and in which the syringe 16 is disposed coaxially with the rotary member 32 for detachable connection thereto. By adopting this configuration, the problems can be solved of the increased exclusively occupied space that would occur when the syringe 16 is disposed in parallel to the pump mechanism 18 and of deterioration of the tube.

2 Claims, 6 Drawing Sheets (a)

(b)

VIEW IN DIRECTION OF ARROW

PASTE APPLICATION DEVICE

TECHNICAL FIELD

The present invention relates to a paste application device for discharging a paste stored within a syringe for applying to an application target material.

BACKGROUND ART

In a die bonding process in fabrication of semiconductor devices, a paste for bonding a semiconductor chip is applied to a substrate such as a lead frame. Conventionally, this paste application is implemented by discharging a paste by a dispenser, and as the dispenser, there is known a dispenser which is configured so that a paste stored in a syringe is pushed out by virtue of air pressure so as to be discharged from a discharge port by a paste discharge screw (refer to FIG. 9 of Patent Document 1). In the related art described in the patent document, the syringe is arranged side by side with a discharge unit which includes a pump mechanism using the paste discharge screw, and the paste is designed to be supplied from the syringe to the discharge unit via a flexible tube.
Patent Document 1: JP-A-2003-117484

DISCLOSURE OF THE INVENTION

Problem that the Invention is to Solve

Incidentally, depending on application target chips, a plurality of paste application points are set on the same chip, and an application nozzle provided with a plurality of discharge ports is used from time to time for such an application target so that paste is applied to the plurality of application points at one time. As this occurs, since the discharge ports of the application nozzle are not arranged in point symmetry but are arranged to have directionality, the application nozzle needs to be rotated to match a direction in which the application target chips are arranged on the substrate. In such a case, in a related art like the one described in the patent document, the tube which supplies the paste rotates together with the discharge unit. Because of this, bending actions are applied to the tube repeatedly in conjunction with the rotation as the application device operating time elapses, and this gradually deteriorates the quality of the tube. This deterioration has caused from time to time drawbacks requiring a cessation of the application device, which drawbacks include a failure of the tube occurring at an unexpected timing and leading to a leakage of paste. In this way, with the conventional paste application device, in addition to the aforesaid problem attributed to the deterioration of the tube to which the syringe connects, there is a problem with layout that the space occupied exclusively by the paste application device is increased, which is attributed to the parallel arrangement of the syringe and the discharge unit.

Then, an object of the invention is to provide a paste application device which can solve the problems of the increased space occupied exclusively by the paste application device due to the arrangement of the syringe and the deterioration of the tube.

Means for Solving the Problem

A paste application device of the invention is a paste application device for applying a paste stored in a syringe to an application target material comprising a rotary member disposed with its axis positioned coaxially with an axis of the syringe having a substantially cylindrical shape and to which a paste feeding port provided at a lower end portion of the syringe is detachably connected, a casing portion which holds the rotary member rotatably about the axis, in which a discharge space is formed for a discharge screw portion provided at a lower portion of the rotary member to fit in and which forms a pump mechanism for sending the paste under pressure by causing the discharge screw portion to rotate about the axis within the discharge space, a discharge port provided at an end portion of the casing portion so as to communicate with the discharge space, a paste feeding path which penetrates through the rotary member in an axial direction and which is formed so as to communicate with a paste outlet hole which is provided to open to the paste feeding port and the discharge screw portion for feeding the paste from the syringe to the pump mechanism, an air pressure supplier for feeding the paste within the syringe to the pump mechanism via the paste feeding path by supplying air pressure into an interior of the syringe such that rotation of the syringe about the axis thereof is permitted, and a discharging rotating drive mechanism for actuating the pump mechanism by causing the rotary member to rotate in a predetermined direction relative to the casing portion to thereby actuate the pump mechanism so as to discharge the paste so fed from the discharge port.

Advantage of the Invention

According to the invention, in the paste application device for applying the paste stored in the syringe to the application target material, by adopting the configuration in which the pump mechanism for supplying the paste under pressure by causing the discharge screw portion provided at the lower portion of the rotary member to rotate about the axis within the discharge space provided in the casing portion, the discharge port communicating with the discharge space is provided at the end portion of the casing portion and the syringe is disposed coaxially with the rotary member for detachable connection, the problems can be solved of the increased exclusively occupied space attributed to the arrangement of the syringe and the deterioration of the tube.

Figure 1:
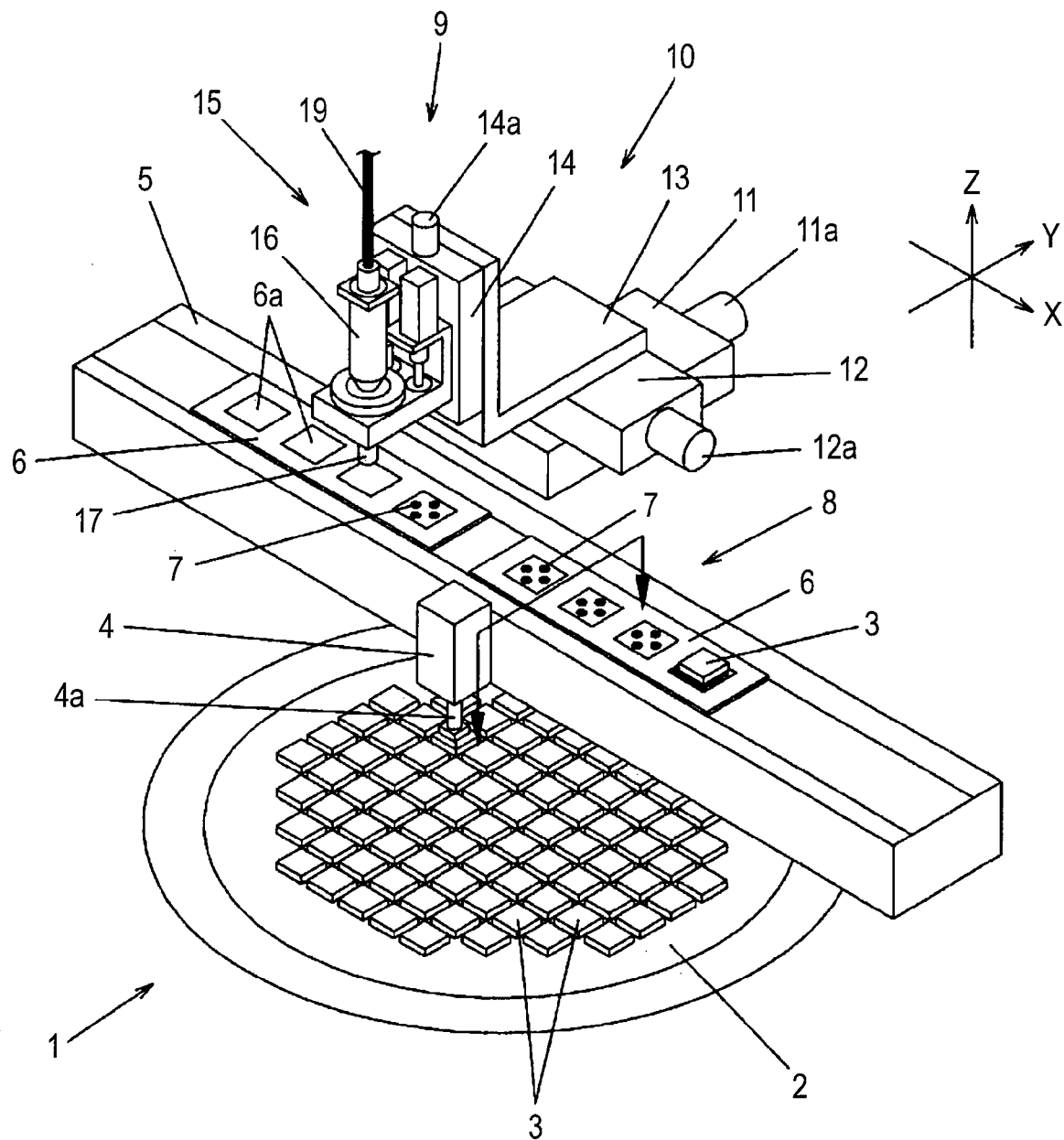
FIG. 1 A perspective view of a die bonding system of an embodiment of the invention.

DESCRIPTION OF REFERENCE NUMERALS 3 semiconductor chip; 6 lead frame; 6a application area; 7 paste; 9 paste applying portion; 10 movable table; 15 paste application unit; 16 syringe; 17 application nozzle; 17a discharge port; 18 pump mechanism; 19 tube; 23A, 23B motor; 26A, 26B drive gear; 27A, 27B driven gear; 31 casing portion; 31*b* discharge space; 32 rotary member; 32*a* internal hole; 32*b* discharge screw portion; 32*c* paste outlet hole; 39 rotary coupling

BEST MODE FOR CARRYING OUT THE INVENTION

Figure 2:
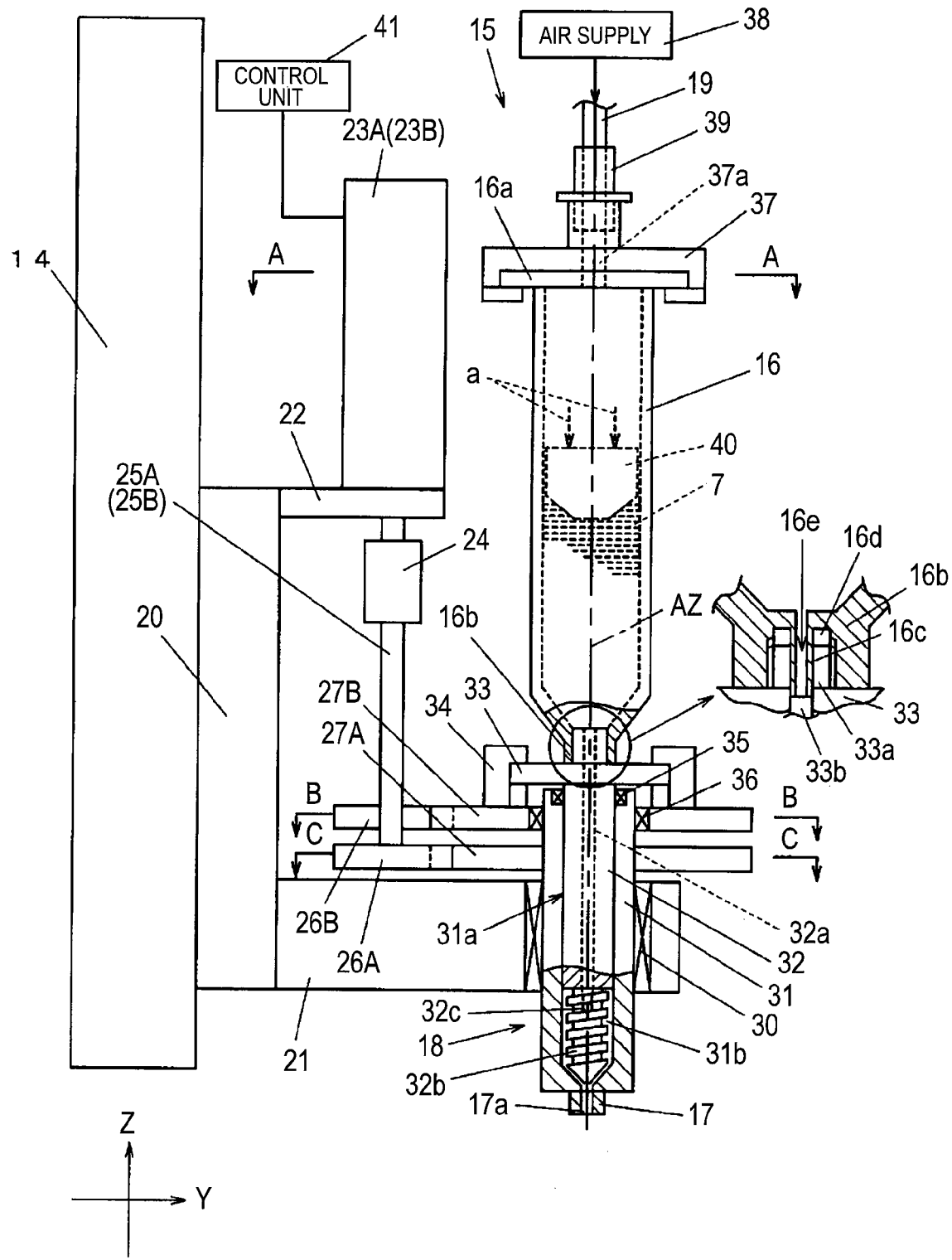
FIG. 2 A side view of a paste application device of the embodiment of the invention.
Figure 3:
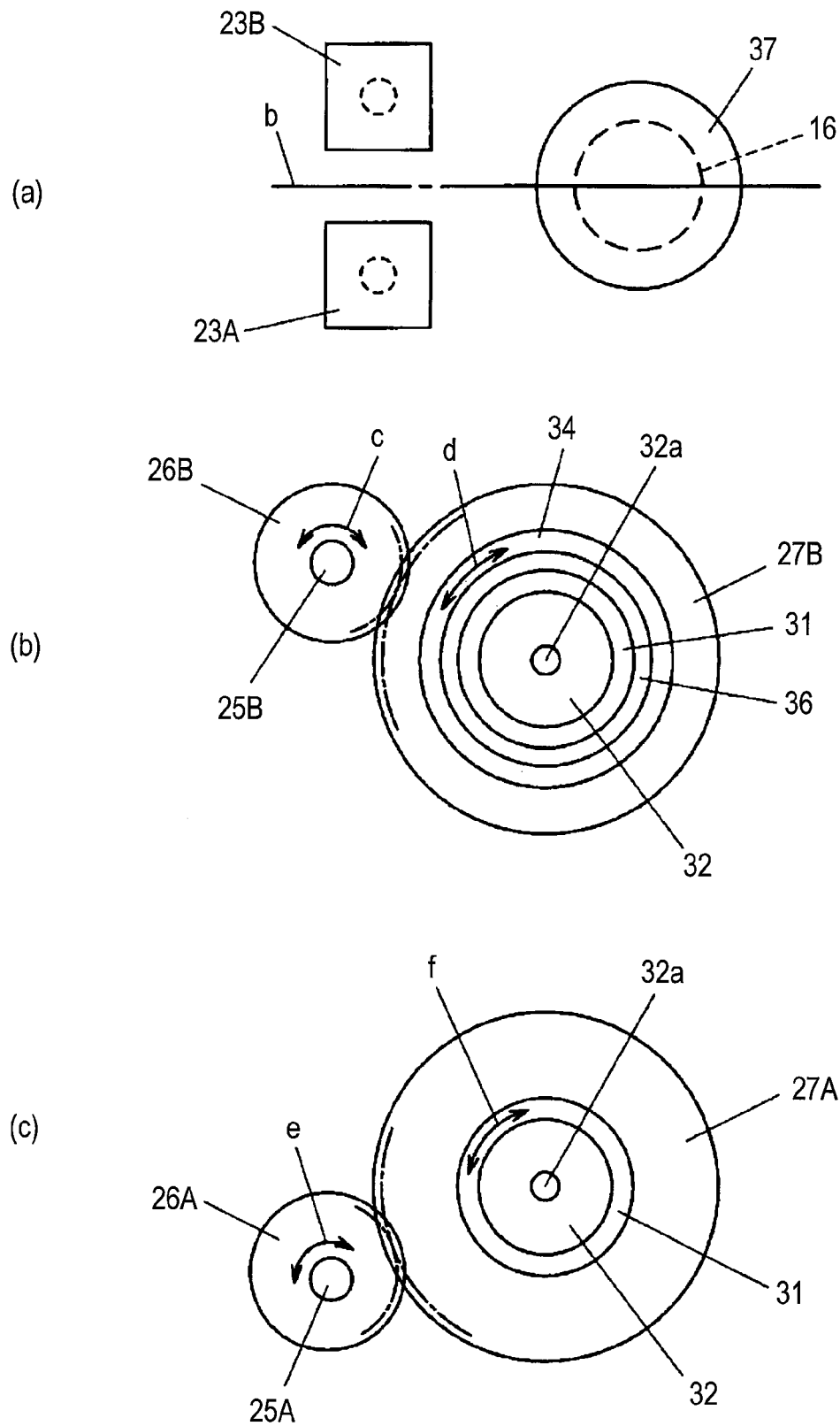
FIG. 3 A partially sectional view of the paste application device of the embodiment of the invention.
Figure 4:
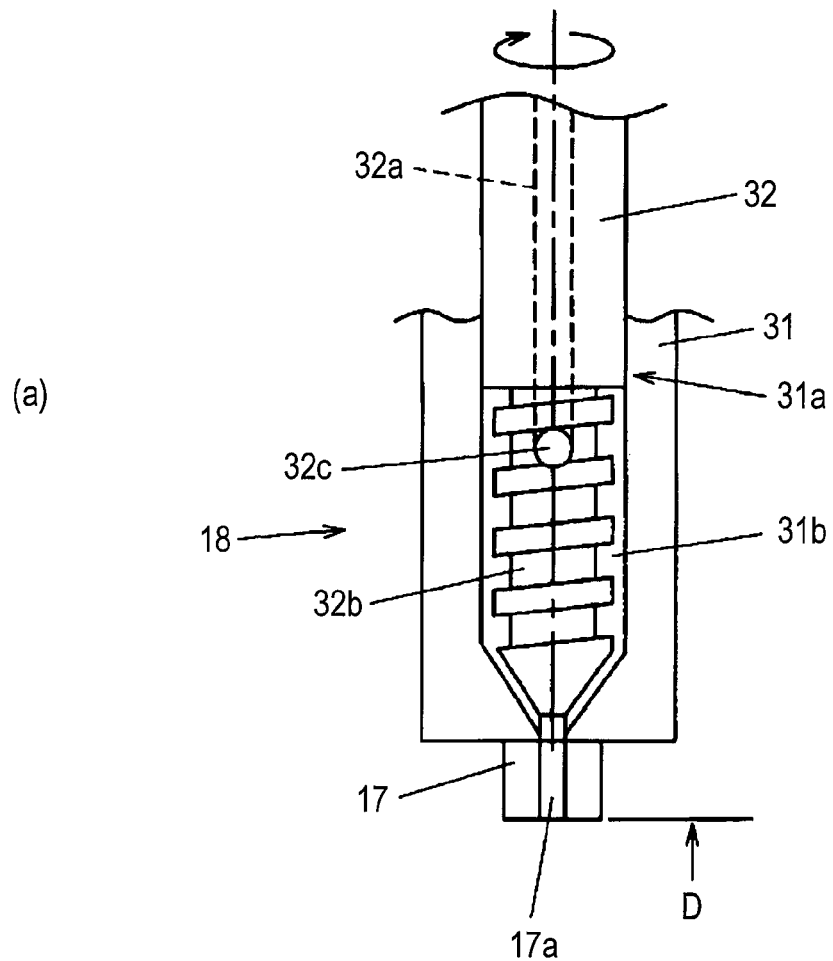
FIG. 4 An explanatory diagram of a pump mechanism of the paste application device of the embodiment of the invention.
Figure 4:
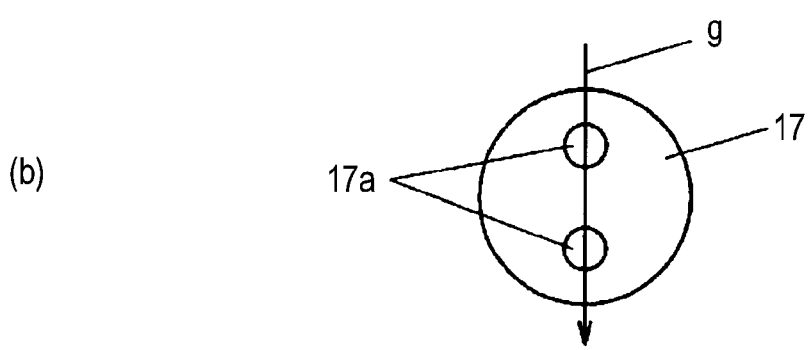
Figure 5:
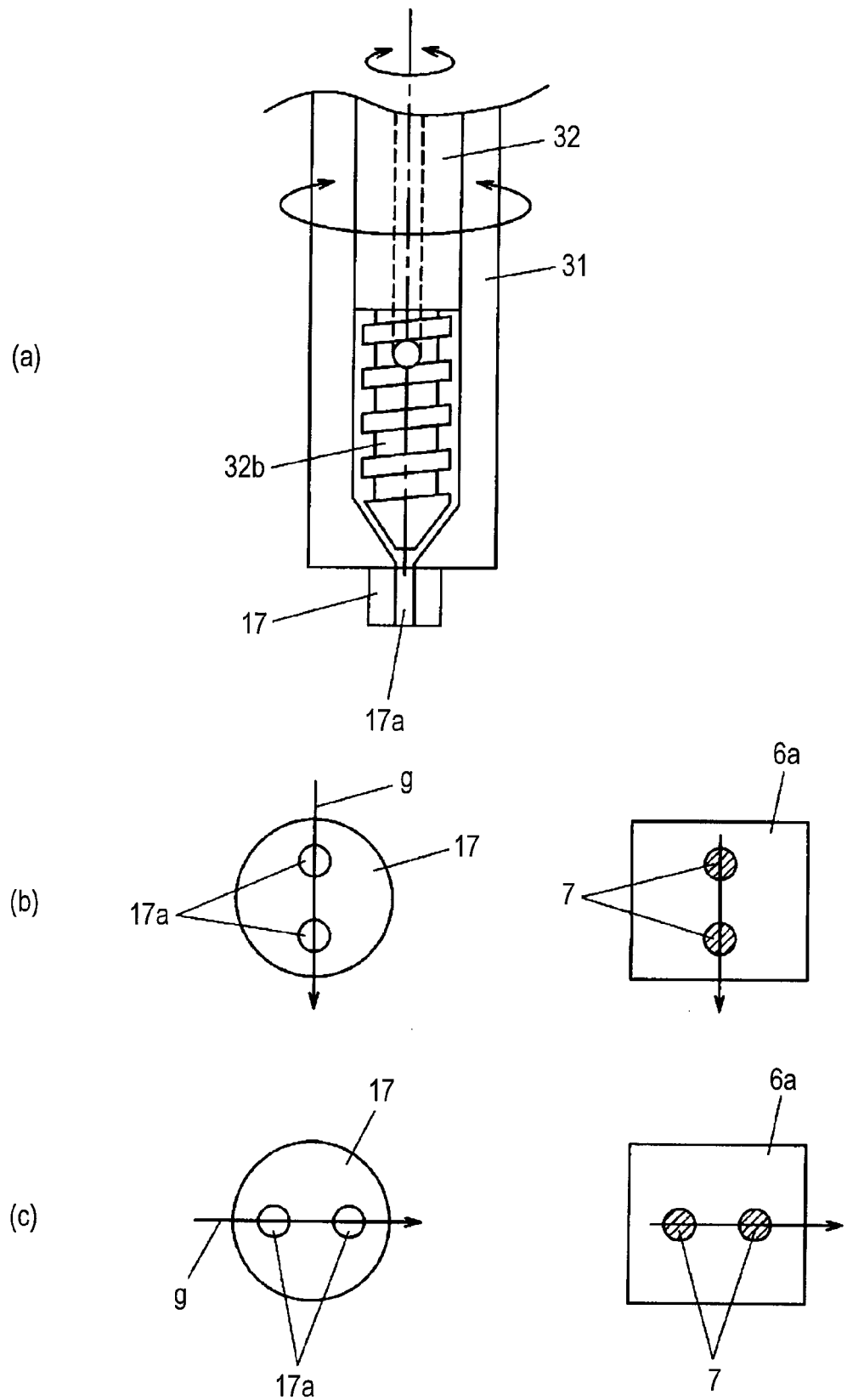
FIG. 5 An explanatory diagram of a paste applying operation of the paste application device of the embodiment of the invention.
Figure 6:
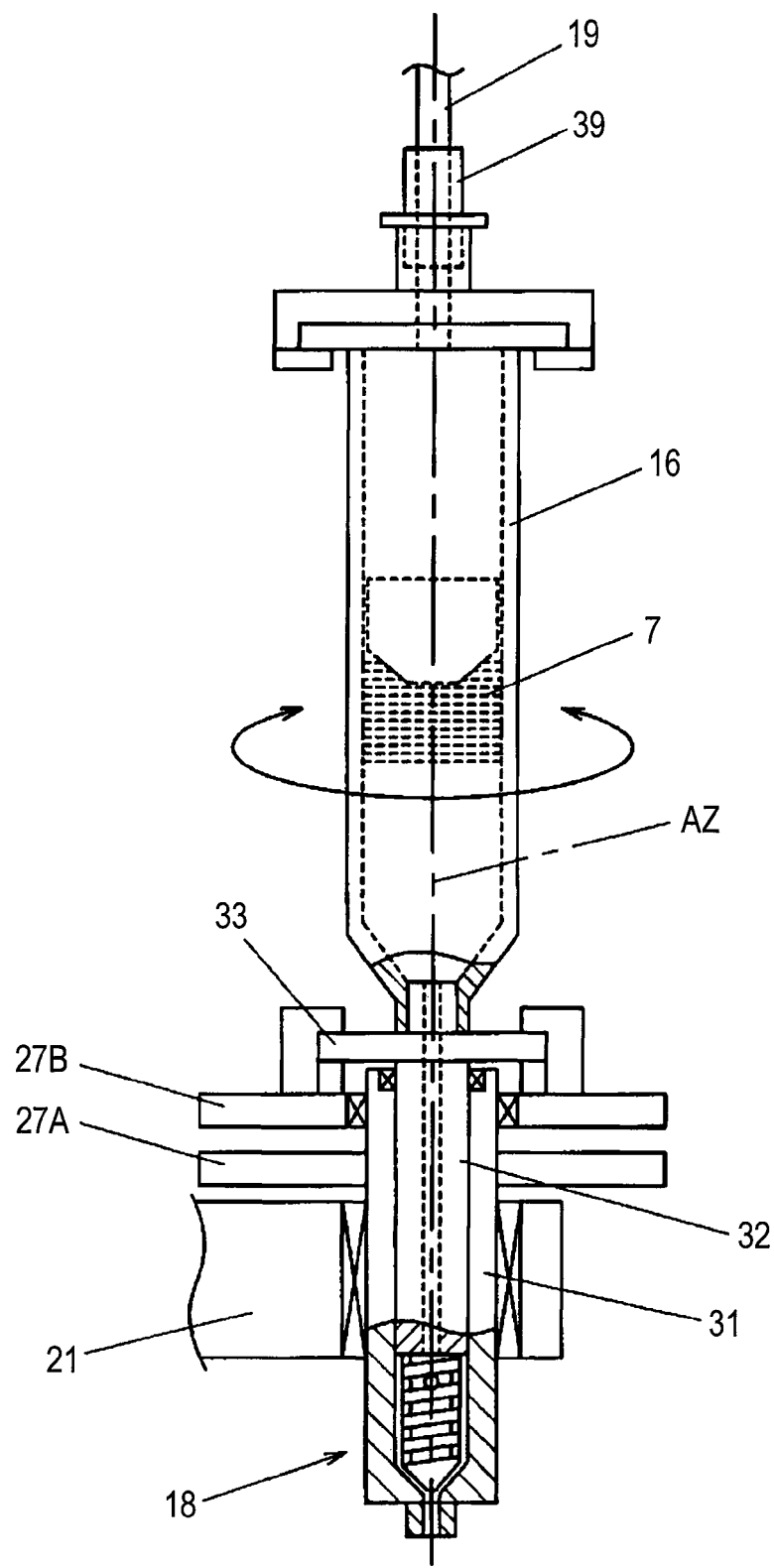
FIG. 6 An explanatory diagram of the paste applying operation of the paste application device of the embodiment of the invention.

Next, referring to the drawings, an embodiment of the invention will be described. FIG. 1 is a perspective view of a die bonding system of an embodiment of the invention, FIG. 2 is a side view of a paste application device of the embodiment of the invention, FIG. 3 is a partially sectional view of the paste application device of the embodiment of the invention, FIG. 4 is an explanatory diagram of a pump mechanism of the paste application device of the embodiment of the invention, and FIGS. 5, 6 are explanatory diagrams of a paste applying operation of the paste application device of the embodiment of the invention.

Firstly, referring to FIG. 1, the construction of the die bonding system will be described. In FIG. 1, a wafer sheet 2 is held by a holding table (whose illustration is omitted) in a chip supply part 1. A plurality of semiconductor chips 3 are affixed to the wafer sheet 2 in a grid-like array. A transport path 5 is disposed to a side of the chip supply part 1. The transport path 5 transports a lead frame 6 and positions the lead frame 6 in a paste applying position and a bonding position. A bonding head 4 is disposed above the chip supply part 1. The bonding head 4 is moved horizontally and vertically by a head moving mechanism (whose illustration is omitted).

A paste applying portion 9 is disposed to a side of the transport path 5. The paste applying portion 9 is configured to include a paste application unit 15 having a function to discharge a paste 7 within a syringe 16 which is a substantially cylindrical container for application which is mounted on a traveling table 10. The traveling table 10 is configured by placing an X-axis table 12 on a Y-axis table 11 and joining a Z-axis table 14 on to the Y-axis table 11 in a vertical direction via an L-type bracket 14. The Y-axis table 11, the X-axis table 12 and the Z-axis table 14 have a Y-axis motor 11*a*, an X-axis motor 12*a* and a Z-axis motor, respectively. The paste application unit 15 moves horizontally and vertically on the lead frame 6 by driving the X-axis motor 12*a*, the Y-axis motor 12*a* and the Z-axis motor 14*a*.

The paste 7, with which the semiconductor 3 is bonded to the lead frame 6, is stored in an interior of the syringe 16 mounted on the paste application unit 15. The paste 7 stored within the syringe 16 is fed by virtue of air pressure supplied from a tube 19, and further, the paste 7 is discharged from an application nozzle 17 provided at a lower end portion by a pump mechanism 18 (refer to FIG. 2) equipped in the paste application unit 15. Chip bonding positions 6*a* on an upper side of the lead frame 6 where semiconductor chips 3 are bonded are application areas 6*a* where the paste is applied. With the application nozzle 17 positioned within the application area 6*a* the paste application unit 15 is moved while the paste 7 is being discharged from the application nozzle 17, whereby the paste 7 is applied in a predetermined application pattern within the application area 6*a* set in a chip installation position on a surface of the lead frame 6. After the application of the paste, the lead frame 6 is sent to a bonding position 8 on the transport path 5 and positioned thereat. Then, a chip 3 picked up from the chip supply part 1 by a nozzle 4*a* of the bonding head 4 is bonded on to the paste 7 applied within the application area 6*a*.

Next, referring to FIGS. 2, 3, 4, the construction of the paste application unit 115 will be described. FIG. 3(*a*), (*b*), (*c*) show a section taken along the line A-A, a section taken along the line B-B and a section taken along the line C-C in FIG. 2, respectively. The paste application unit 15 constitutes a paste application device for applying the paste stored in the syringe 16 to the lead frame 6 which constitutes a paste application target material. In FIG. 2, a lifting member 20 is installed on a side of the Z-axis table 14 which is disposed vertically. A motor bracket 22 and a holding block 21 are provided at an upper portion and a lower portion of the lifting member 20, respectively, so as to extend in a Y-direction. A motor 23A and a motor 23B are disposed on the motor bracket 22 in a vertical posture, and the motors 23A, 23B are controlled for rotation by a control unit 41.

As is shown in FIG. 3(*a*), the motors 23A, 23B are disposed in symmetrical positions with respect to a center line (indicated by an arrow b) of the syringe 16. Drive gears 26A, 26B are connected, respectively, to lower end portions of drive shafts 25A, 25B which are connected to the motors 23A, 23B, respectively, via couplings 24. The drive gears 26A, 26B mesh with driven gears 27A, 27B, respectively.

A substantially cylindrical casing portion 31 is pivotally supported in a vertical posture on the holding block 21 via a bearing 30. A fitting hole 31*a* is formed along a vertical axis AZ in an interior of the casing portion 31, and the application nozzle 17, in which discharge ports 17*a* (refer to FIG. 4(*b*)) for discharging the paste are formed, is provided at a lower end portion of the casing portion 31 so as to project therefrom. A rotary member 32 in which an internal hole 32*a* is formed along a center axis thereof is fitted in the fitting hole 31*a*, and the rotary member 32 is pivotally supported in a vertical posture via a bearing 35 securely fitted in the casing portion 31 so as to rotate freely relative to the casing portion 31.

A disk-shaped syringe mounting plate 33 is joined to an upper end portion of the rotary member 32, and a mounting portion 16*b* provided at a lower end portion of the syringe is detachably mounted on the syringe mounting plate 33. A mounting external thread portion 33*a*, around an outer circumference of which external thread portion is formed, is provided on an upper side of the syringe mounting plate so as to project upwards therefrom, while a mounting internal thread portion 16*d*, on which an internal thread portion is formed, is provided on the mounting portion 16*b* so as to screw into the mounting external thread portion. In a syringe mounted state in which the mounting internal thread portion 16*d* is screwed into the mounting external thread portion 33*a* to thereby be fastened together, the syringe 16 is in a coaxial position where its vertical axis AZ coincides with the axis AZ of the rotary member 32.

In this syringe mounted state, a paste feeding projecting portion 16*c*, which is provided within the mounting internal thread portion 16*d* so as to project downwards, fits in a fitting hole 33*b* which is provided so as to penetrate through the syringe mounting plate 33. A paste feeding port 16*e*, which communicates with an interior of the syringe 16, is provided in the paste feeding projecting portion 16*c*, and the interior of the syringe 16 communicates with the internal hole 32*a* via the paste feeding port 16*e*. In the configuration described above, the rotary member 32 is disposed in the coaxial position with its axis aligned with the axis AZ of the substantially cylindrical syringe 16, so that the paste feeding port 16*e* provided at the lower end portion of the syringe 16 is designed to be detachably connected to the rotary member 32. The casing portion 31 holds the rotary member 32 so as to rotate freely about the axis AZ via the bearing 35.

A flange portion 16*a* is provided at the upper end portion of the syringe 16 so as to extend sideways, and a lid member 37 is mounted on the flange portion 16*a* so as to close an opening in an upper side of the syringe 16. The tube 19 (also refer to FIG. 1) is connected to an air supply hole 37$a$ provided in the lid member 37 via a rotary coupling 39, and further, the tube 19 is connected to an air supply 38. Air pressure is supplied to the interior of the syringe 16 via the tube 19 and the air supply hole 37$a$ by the air supply 38 being activated. The supply of air pressure is controlled so as to be on or off and to be strong or weak by an air pressure control unit (whose illustration is omitted) which takes a form in which an air pressure control valve is controlled by the control unit 41.

A piston 40 is mounted in the interior of the syringe 16, and a force (indicated by an arrow a) is caused to act by the air pressure so supplied which pushes the piston 40 downwards. The paste 7 stored in the syringe 16 is pushed downwards by the force acting downwards to thereby be fed into the internal hole 32$a$ in the rotary member 32 via the paste feeding port 16$e$. The air supply 38 and the tube 19 make up an air pressure supplier for feeding the paste 7 within the syringe 16 to the pump mechanism 18 via the internal hole 32$a$ which functions as a paste feeding path by supplying the air pressure into the interior of the syringe 16 with the rotation of the syringe 16 about the axis AZ permitted.

The syringe mounting plate 33 is joined to the driven gear 27B via a joining member 34. The driven gear 27B is securely fitted on an outer circumference of the casing portion 31 via a bearing 36, so as to be pivotally supported to rotate freely relative to the casing portion 31. As is shown in FIG. 3($b$), the driven gear 27B meshes with the drive gear 26B, whereby the driven gear 27B rotates by the motor 23B being driven to rotate the drive gear 26 (indicated by an arrow c) via the drive shaft 25B, and the rotation of the driven gear 27B is then transmitted to the rotary member 32 via the joining member 34 and the syringe mounting plate 33. By the rotary member 32 rotating, the paste 7 is discharged by the pump mechanism 18, which will be described below. The driven gear 27A is joined to an outer circumference of the casing portion 31. The driven gear 27 meshes with the drive gear 26A, whereby the driven gear 27A rotates by the motor 23A being driven to rotate (as indicated by an arrow e) the drive gear 26A, which rotates the casing portion 31 (as indicated by an arrow f).

Referring to FIG. 4, the pump mechanism 18 will be described. As is shown in FIG. 4($a$), a discharge screw portion 32$b$, in which a screw groove is formed for moving the paste 7 axially downwards, is provided at a lower portion of the rotary member 32, and the discharge screw portion 32$a$ fits in a discharge space 31$b$ at a lower portion of the fitting hole 31$a$ of the discharge screw portion 32$b$. A paste outlet hole 32$c$, which communicates with a lower end portion of the internal hole 32$a$, is opened in the discharge screw portion 32$b$. Consequently, the paste 7 sent out from the syringe 16 via the internal hole 32$a$ is fed into the discharge space 31$b$.

By the motor 23B being driven to rotate the rotary member 32 so as to rotate the discharge thread portion 32$b$ in the discharge space 31$b$ in a paste feeding direction (a direction indicated by an arrow in FIG. 4), the paste 7 which is now fed into the discharge space 31$b$ from the paste outlet hole 32$c$ is sent axially downwards under pressure by rotation of the discharge thread portion 32$b$. The casing portion 31 where the discharge space 31$b$ is provided and the rotary member 32 where the discharge thread portion 32$b$ is provide make up the pump mechanism 18 which sends the paste 7 under pressure by rotating the discharge thread portion 32$b$ about the axis AZ within the discharge space 31$b$.

The paste 7 which is sent under pressure by the pump mechanism 18 is discharged form the discharge ports 17$a$. The discharge ports 17$a$ are provided at an end portion of the casing portion 31 so as to communicate with the discharge space 31$b$. In the configuration described above, the internal hole 32$a$ is formed so as to penetrate through the rotary member 32 in an axial direction to communicate with the paste outlet hole 32$c$ which is provided to open to the paste feeding port 16$e$ and the discharge thread portion 32$b$, to thereby make up a paste feeding path for feeding the paste from the syringe 16 to the pump mechanism 18. In addition, the motor 23B, the drive gear 26B and the driven gear 27B make up a discharging rotary drive mechanism for discharging the paste 7 so fed from the discharge port 17 by causing the rotary member 32 to rotate in a predetermined direction relatively to the casing portion 31 to activate the pump mechanism 18.

As is shown in FIG. 4($b$) which is viewed in a direction indicated by an arrow D, the plurality of (two herein) discharge ports 17$a$ are provided in the application nozzle 17, whereby in a paste applying operation in which the paste 7 is discharged from the application nozzle 17 to be applied to the application area 6$a$ of the lead frame 6, the paste 7 can be applied to a plurality of application points at the same time. A direction reference line (indicated by an arrow g) is set in arranging the plurality of discharge ports 17$a$, and herein, a direction in which the two discharge ports 17$a$ are connected coincides with the direction reference line. In the paste applying operation, an operation is carried out of aligning this direction reference line with a predetermined direction in the application area 6$a$ of the lead frame 6.

Namely, by controlling the motor 23A by the control unit 41 so as to drive to rotate the casing portion 31 as shown in FIG. 5($a$), the direction reference line of the discharge ports 17$a$ is aligned with an applying direction in the application area 6$a$ of the application target. FIGS. 5($b$), ($c$) show an example in which by aligning the direction reference line (indicated by the arrow g) shown in FIG. 4($b$) with the applying direction of the application area 6$a$, the paste 7 is discharge from the discharge ports 17$a$ so as to be applied to the application area 6$a$. In the configuration described above, the motor 23A, the drive gear 26A and the driven gear 27A make up a casing portion rotating drive mechanism for rotating the casing portion 31 which is provided to rotate freely about the axis AZ to thereby position the direction reference line in the arrangement of the plurality of discharge ports 17$a$ in a desired rotating position.

In addition, when driving the motor 23A to rotate the casing portion 31, the motors 23A, 23B are driven at the same time by controlling the motors 23A, 23B by the control unit 41, and the rotary member 32 is caused to rotate in synchronism with the casing portion 31 so that the rotary member 32 does not rotate relatively to the casing portion 31. By doing so, an unnecessary discharge of the paste 7 can be prevented when the casing portion 31 rotates.

When activating the pump mechanism 18 to operate in the aforesaid paste applying operation or in the casing portion rotating operation for alignment of the direction of the discharge ports 17$a$, the syringe 16 also rotates together (refer to arrow in FIG. 6). As this occurs, as is shown in FIG. 6, since the tube 19 for supply air pressure into the syringe 16 is connected to the syringe 16 via the rotary coupling 39, the tube 19 stays in a fixed state even when the syringe 16 is rotating. Consequently, there is caused no problem like the problem of flexure of the tube that occurs in the related art in which the syringe is disposed in parallel to the discharge unit. Namely, flexure in association with the rotation of the syringe 16 does not act on the tube 19, and therefore, the material of the tube 19 is not deteriorated in any way. Hence, the drawback does not occur that requires a cessation of the application device including a failure of the tube at an unexpected timing, leading to a leakage of paste. In addition, since the pump mechanism 18 and the syringe 16 are disposed coaxially, the space to be occupied exclusively by the paste application device can be reduced.

Further, in the configuration described above, by controlling the motors 23A, 23B by the control unit 41, the syringe 16 can be rotated in an arbitrary rotating operation pattern. Namely, only syringe 16 is allowed to rotate without the pump mechanism 18 functioning, and the paste 7 stored in the interior thereof is allowed to flow in the rotating direction of the syringe 16 as the syringe 16 rotates by virtue of the viscosity of the paste 7. In this entrainment of the paste 7, by combining the rotating operation patterns of the syringe 16, that is, by combining a reversal in the rotating direction and acceleration or deceleration together, prior to discharge of the paste 7 for application, a stirring and kneading operation for the purpose of adjusting the viscosity of the paste 7 in the syringe 16 can be performed in various patterns.

While the invention has been described in detail and by reference to the specific embodiment, it is obvious to those skilled in the art that various alterations and modifications can be applied thereto without departing from the spirit and scope of the invention.

This patent application is based on Japanese Paten Application No. 2007-3181321 filed on Dec. 10, 2007, the contents of which are incorporated herein by reference.

INDUSTRIAL APPLICABILITY

The paste application device of the invention is advantageous in that the problem attributed to the arrangement of the discharge unit and the syringe can be eliminated and that the space occupied exclusively thereby can be reduced and is useful in application of bonding pastes in the electronic equipment fabrication field.

The invention claimed is:

1. A paste application device for applying a paste stored in a syringe to an application target material comprising:
a rotary member disposed with an axis thereof positioned coaxially with an axis of the syringe having a substantially cylindrical shape and to which a paste feeding port provided at a lower end portion of the syringe is detachably connected;
a casing portion which holds the rotary member rotatably about the axis, in which a discharge space is formed for a discharge screw portion provided at a lower portion of the rotary member to fit in and which forms a pump mechanism for sending the paste under pressure by causing the discharge screw portion to rotate about the axis within the discharge space, a discharge port provided at an end portion of the casing portion so as to communicate with the discharge space;
a paste feeding path which penetrates through the rotary member in an axial direction and which is formed so as to communicate with a paste outlet hole which is provided to open to the paste feeding port and the discharge screw portion for feeding the paste from the syringe to the pump mechanism;
an air pressure supplier for feeding the paste within the syringe to the pump mechanism via the paste feeding path by supplying air pressure into an interior of the syringe such that rotation of the syringe about the axis thereof is permitted; and
a discharging rotating drive mechanism for actuating the pump mechanism by causing the rotary member to rotate in a predetermined direction relative to the casing portion to thereby actuate the pump mechanism so as to discharge the paste so fed from the discharge port.

2. A paste application device as set forth in claim 1, wherein
a plurality of discharge ports like the discharge port are provided in the casing portion, and comprising a casing portion rotating drive mechanism for rotating the casing portion that is provided to rotate freely about the axis to thereby position a direction reference line for arrangement of the plurality of discharge ports in a desired position.

\* \* \* \* \*